United States Patent
Hatwar et al.

(10) Patent No.: US 7,238,436 B2
(45) Date of Patent: Jul. 3, 2007

(54) STABILIZED WHITE-LIGHT-EMITTING OLED DEVICE

(75) Inventors: Tukaram K. Hatwar, Penfield, NY (US); J. Ramon Vargas, Webster, NY (US); Viktor V. Jarikov, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 441 days.

(21) Appl. No.: 10/690,940

(22) Filed: Oct. 22, 2003

(65) Prior Publication Data

US 2005/0089714 A1   Apr. 28, 2005

(51) Int. Cl.
*H05B 33/14* (2006.01)
*H01L 51/50* (2006.01)

(52) U.S. Cl. ............... 428/690; 428/917; 313/504; 313/506

(58) Field of Classification Search ............... 428/690, 428/917; 313/504, 506
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,405,709 A | 4/1995 | Littman et al. | |
| 5,683,823 A | 11/1997 | Shi et al. | |
| 6,091,196 A * | 7/2000 | Codama | 313/504 |
| 6,392,340 B2 | 5/2002 | Yoneda et al. | |
| 6,465,116 B1 | 10/2002 | Ishikawa et al. | |
| 6,753,097 B2 * | 6/2004 | Toguchi et al. | 428/690 |
| 2002/0034654 A1 | 3/2002 | Toguechi et al. | |

FOREIGN PATENT DOCUMENTS

| | | |
|---|---|---|
| EP | 1 182 244 | 2/2002 |
| EP | 1 359 790 | 11/2003 |
| JP | 07-142169 | 2/1995 |

OTHER PUBLICATIONS

"White-light-emitting organic electroluminescent devices based on interlayer sequential energy transfer" by R. S. Deshpande et al., Applied Physics Letters, vol. 75, No. 7, Aug. 16, 1999, pp. 888-890.
"Multilayer white light-emitting organic electroluminescent device" by Junji Kido et al., Science vol. 267, Mar. 3, 1995, pp. 1332-1334.
White light-emitting organic electroluminescent devices using the poly (N-vinylcarbazole) emitter layer doped with three fluorescent dyes by J. Kido et al., Applied Physics Letter 64 (7), Feb. 14, 1994, pp. 815-817.

* cited by examiner

*Primary Examiner*—Dawn L. Garrett
(74) *Attorney, Agent, or Firm*—Raymond L. Owens

(57) ABSTRACT

A stabilized white-light-emitting OLED device includes an anode, a cathode, a light-emitting layer disposed between the anode and the cathode, and a stabilizing substituted perylene material, so that the lifetime of the white-light-emitting OLED device is increased.

20 Claims, 3 Drawing Sheets

STABILIZED WHITE-LIGHT-EMITTING OLED DEVICE

CROSS REFERENCE TO RELATED APPLICATIONS

Reference is made to commonly assigned U.S. patent application Ser. No. 10/131,801 filed Apr. 24, 2002 by Viktor V. Jaiikov, entitled "Organic Light-Emitting Diode Devices With Improved Operational Stability"; commonly assigned U.S. patent application Ser. No. 10/244,314 filed Sep. 16, 2002 by Tukaram K. Hatwar, entitled "White Organic Light-Emitting Devices With Improved Performance"; commonly assigned U.S. patent application 10/691,326 filed Oct. 22, 2003 by Viktor V. Jarikov et al., entitled "Aggregate Organic Light Emitting Diode Devices With Improved Operational Stability", the disclosures of which are herein incorporated by reference.

FIELD OF THE INVENTION

The present invention relates to white-light-emitting OLED devices which have improved lifetime.

BACKGROUND OF THE INVENTION

An OLED device includes a substrate, an anode, an organic luminescent layer, and a cathode. An OLED device often includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing, and capability for full-color flat emission displays. Tang et al. described this multilayer OLED device in their U.S. Pat. Nos. 4,769,292 and 4,885,211.

Efficient white light producing OLED devices are considered a low cost alternative for several applications such as paper-thin light sources, backlights in LCD displays, automotive dome lights, and office lighting. White light producing OLED devices should be bright, efficient, and generally have Commission International d'Eclairage (CIE) chromaticity coordinates of about (0.33, 0.33). In any event, in accordance with this disclosure, white light is that light which is perceived by a user as having a white color.

The following patents and publications disclose the preparation of organic OLED devices capable of emitting white light, comprising a hole-transporting layer and an organic luminescent layer, and interposed between a pair of electrodes.

White light producing OLED devices have been reported before by J. Shi (U.S. Pat. No. 5,683,823) wherein the luminescent layer includes red and blue light-emitting materials uniformly dispersed in a host emitting material. This device has good electroluminescent characteristics, but the concentration of the red and blue dopants are very small, such as 0.12% and 0.25% of the host material. These concentrations are difficult to control during large-scale manufacturing. Sato et al. in JP 07,142,169 discloses an OLED device, capable of emitting white light, made by forming a blue light-emitting layer next to the hole-transporting layer and followed by a green light-emitting layer having a region containing a red fluorescent layer.

Kido et al., in Science, Vol. 267, p. 1332 (1995) and in APL Vol. 64, p. 815 (1994), report a white light producing OLED device. In this device three emitter layers with different carrier transport properties, each emitting blue, green or red light, are used to generate white light. Littman et al. in U.S. Pat. No. 5,405,709 disclose another white emitting device, which is capable of emitting white light in response to hole-electron recombination, and comprises a fluorescent in a visible light range from bluish green to red. Recently, Deshpande et al., in Applied Physics Letters, Vol. 75, p. 888 (1999), published a white OLED device using red, blue, and green luminescent layers separated by a hole blocking layer.

However, these OLED devices require a very small amount of dopant concentrations, making the process difficult to control for large-scale manufacturing. Also, emission color varies due to small changes in the dopant concentration. White OLEDs are used making full-color devices using a color filter array. An example of a white color filter array top emitting device is shown in U.S. Pat. No. 6,392,340. However, the color filter transmits only about 30% of the original light. Therefore, high luminance efficiency and stability are required for the white OLEDs.

SUMMARY OF THE INVENTION

It is therefore an object of the present invention to provide a white-emitting OLED device with improved lifetime.

This object is achieved by a stabilized white-light-emitting OLED device, comprising:
 a) an anode;
 b) a cathode;
 c) a light-emitting layer disposed between the anode and the cathode; and
 d) a stabilizing substituted perylene material, so that the lifetime of the white-light-emitting OLED device is increased.

ADVANTAGES

It has been discovered that dibenzoperylene or derivatives thereof can be provided in one or more of the organic layers of an OLED white-light-emitting device in a sufficient amount to stabilize the OLED device and improve its lifetime.

Figure 1:
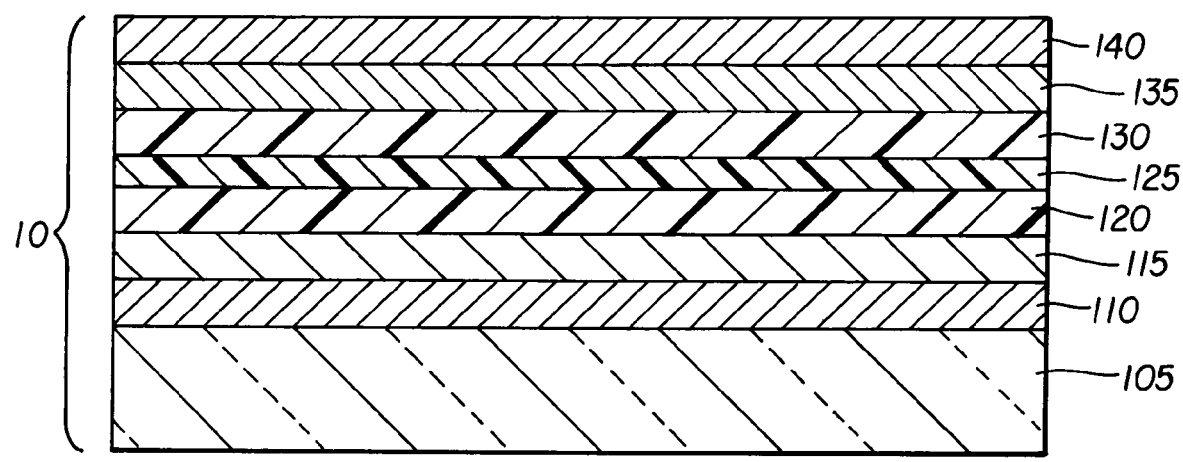
FIG. 1 shows a cross-sectional view of a pixel of an OLED device, which can be used according to a preferred embodiment of the present invention.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "display" or "display panel" is employed to designate a screen capable of electronically displaying video images or text. The term "pixel" is employed in its art-recognized usage to designate an area of a display panel that can be stimulated to emit light independently of other areas. The term "OLED device" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any hue or combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. For the purposes of this invention, the terms "pixel" and "subpixel" will be used interchangeably. The term "pitch" is used to designate the distance separating two pixels or subpixels in a display panel. Thus, a subpixel pitch means the separation between two subpixels.

For top emitting active-matrix organic EL displays, an alternative organic EL structure using broadband emitting (commonly referred to as "white" or "white-light-emitting") materials coupled with a color filter array (CFA) is sometimes beneficial. The terms "white", "white emission" or "white-light-emitting" refer to emission of a broad range of wavelengths encompassing the colors desired for the displays but do not necessarily refer to a specific color. For example, a display designed to have yellow and red subpixels cannot be considered to be white emitting without blue wavelengths in the emission, so that if the direct emission (that is without color filters) were visible to a viewer it would be perceived as being orange in color.

Turning now to FIG. 1, there is shown a cross-sectional view of an OLED device pixel 10 which can be used according to a first embodiment of the present invention. In some embodiments, pixel 10 can be a subpixel as defined above. The pixel includes a substrate 105, an anode 110 disposed over substrate 105, and a cathode 140 spaced from anode 110. An optional hole-injecting layer 115 is disposed over anode 110, and hole-transporting layer 120 is disposed over hole-injecting layer 115. A first light-emitting layer 125 and a second light-emitting layer 130 are disposed over the hole-transporting layer 120. An electron-transporting layer 135 can be disposed over second light-emitting layer 130. These layers will be described in more detail.

Substrate 105 can be an organic solid, an inorganic solid, or a combination of organic and inorganic solids that provides a surface for receiving organic material from a donor. Substrate 105 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 105 can be a homogeneous mixture of materials, a composite of materials, or multiple layers of materials. Substrate 105 can be an OLED substrate, that is a substrate commonly used for preparing OLED devices, e.g. active-matrix low-temperature polysilicon TFT substrate. The substrate 105 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing or light reflective. Substrates for use in this case include, but are not limited to, glass, plastic, semiconductor materials, ceramics, and circuit board materials, or any others commonly used in the formation of OLED devices, which can be either passive-matrix devices or active-matrix devices.

An electrode is formed over substrate 105 and is most commonly configured as an anode 110. When EL emission is viewed through the substrate 105, anode 110 should be transparent or substantially transparent to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. The preferred anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful that a hole-injecting layer 115 be formed over anode 110 in an organic light-emitting display. The hole-injecting material can serve to improve the film formation property of subsequent organic layers and to facilitate injection of holes into the hole-transporting layer. Suitable materials for use in hole-injecting layer 115 include, but are not limited to, porphyrinic compounds as described in U.S. Pat. No. 4,720,432, and plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1,029,909 A1.

While not always necessary, it is often useful that a hole-transporting layer 120 be disposed over the hole-injecting layer 115, or over anode 110 if no hole-injecting layer is used. Desired hole-transporting materials can be deposited by any suitable means such as evaporation, sputtering, chemical vapor deposition, electrochemical means, thermal transfer, or laser thermal transfer from a donor material. Hole-transporting materials useful in hole-transporting layer 120 are well known to include compounds such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A

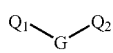

A wherein:
$Q_1$ and $Q_2$ are independently selected aromatic tertiary amine moieties; and
G is a linking group such as an arylene, cycloalkylene, or alkylene group of a carbon to carbon bond.

In one embodiment, at least one of $Q_1$ or $Q_2$ contains a polycyclic fused ring structure, e.g., a naphthalene. When G is an aryl group, it is conveniently a phenylene, biphenylene, or naphthalene moiety.

A useful class of triarylamines satisfying structural Formula A and containing two triarylamine moieties is represented by structural Formula B

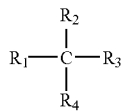

B where:
$R_1$ and $R_2$ each independently represent a hydrogen atom, an aryl group, or an alkyl group or $R_1$ and $R_2$ together represent the atoms completing a cycloalkyl group; and
$R_3$ and $R_4$ each independently represent an aryl group, which is in turn substituted with a diaryl substituted amino group, as indicated by structural Formula C

C wherein $R_5$ and $R_6$ are independently selected aryl groups. In one embodiment, at least one of $R_5$ or $R_6$ contains a polycyclic fused ring structure, e.g., a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D

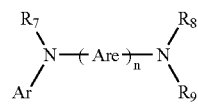

D wherein:
each Are is an independently selected arylene group, such as a phenylene or anthracene moiety;
n is an integer of from 1 to 4; and
Ar, $R_7$, $R_8$, and $R_9$ are independently selected aryl groups.
In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens such as fluoride, chloride, and bromide. The various alkyl and alkylene moieties typically contain from 1 to about 6 carbon atoms. The cycloalkyl moieties can contain from 3 to about 10 carbon atoms, but typically contain five, six, or seven carbon atoms—e.g., cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, such as a triarylamine satisfying the Formula B, in combination with a tetraaryldiamine, such as indicated by Formula D. When a triarylamine is employed in combination with a tetraaryldiamine, the latter is positioned as a layer interposed between the triarylamine and the electron-injecting and transporting layer. Illustrative of useful aromatic tertiary amines are the following:

1,1-Bis(4-di-p-tolylaminophenyl)-4-phenylcyclohexane
1,1-Bis(4-di-p-tolylaminophenyl)cyclohexane
1,5-Bis[N-(2-naphthyl)-N-phenylamino]naphthalene
1,5-Bis[N-(1-naphthyl)-N-phenylamino]naphthalene
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene
2,6-Bis[N,N-di(2-naphthyl)amine]fluorene
4-(di-p-tolylamino)-4'-[4(di-p-tolylamino)-styryl]stilbene
4,4"-Bis[N-(1-anthryl)-N-phenylamino]-p-terphenyl
4,4"-Bis[N-(1-naphthyl)-N-phenylamino]p-terphenyl
4,4',4"-tris[(3-methylphenyl)phenylamino]triphenylamine
4,4'-Bis[N-(1-naphthyl)-N-(2-naphthyl)amino]biphenyl
4,4'-Bis(diphenylamino)quadriphenyl
4,4'-Bis[N-(1-coronenyl)-N-phenylamino]biphenyl
4,4'-Bis[N-(1-naphthyl)-N-phenylamino]biphenyl
4,4'-Bis[N-(2-naphthacenyl)-N-phenylamino]biphenyl
4,4'-Bis[N-(2-naphthyl)-N-phenylamino]biphenyl
4,4'-Bis[N-(2-perylenyl)-N-phenylamino]biphenyl
4,4'-Bis[N-(2-phenanthryl)-N-phenylamino]biphenyl
4,4'-Bis[N-(2-pyrenyl)-N-phenylamino]biphenyl
4,4'-Bis[N-(3-acenaphthenyl)-N-phenylamino]biphenyl
4,4'-Bis[N-(8-fluoranthenyl)-N-phenylamino]biphenyl
4,4'-Bis[N-(9-anthryl)-N-phenylamino]biphenyl
4,4'-Bis[N-phenyl-N-(2-pyrenyl)amino]biphenyl
4,4'-Bis{N-phenyl-N-[4-(1-naphthyl)-phenyl]amino}biphenyl
Bis(4-dimethylamino-2-methylphenyl)-phenylmethane N,N,N',N'-Tetra(2-naphthyl)-4,4"-diamino-p-terphenyl
N,N,N',N'-Tetraphenyl-4,4'-diaminobiphenyl
N,N,N',N'-Tetra-p-tolyl-4-4'-diaminobiphenyl
N,N,N',N'-tetra-1-naphthyl-4,4'-diaminobiphenyl
N,N,N-Tri(p-tolyl)amine
N,N'-di-1-naphthalenyl-N,N'-diphenyl-4,4'-diaminobiphenyl
N-Phenylcarbazole
Poly(N-vinylcarbazole)

Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-emitting layers 125 and 130 produce light in response to hole-electron recombination. Light-emitting layers 125 and 130 are formed over anode 110 and over any other layers formed, such as hole-transporting layer 120. In this embodiment, light-emitting layers 125 and 130 are disposed between hole-transporting layer 120 and cathode 140, and first light-emitting layer 125 is in contact with hole-transporting layer 120. Desired organic light-emitting materials can be deposited by any suitable means such as evaporation, sputtering, chemical vapor deposition, electrochemical means, or radiation thermal transfer from a donor material. Useful organic light-emitting materials are well known. As more fully described in U.S. Pat. Nos. 4,769,292 and 5,935,721, the light-emitting layers of the organic EL element comprise a luminescent or fluorescent material where electroluminescence is produced as a result of electron-hole pair recombination in this region. The light-emitting layers can be comprised of a single material, but more commonly include a host material doped with a guest compound or dopant where light emission comes primarily from the dopant and can be of any color. The host materials in the light-emitting layers can be an electron-transporting material, as defined below, a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material.

An important relationship for choosing a dye as a dopant is a comparison of the bandgap potential which is defined as the energy difference between the highest occupied molecular orbital and the lowest unoccupied molecular orbital of the molecule. For efficient energy transfer from the host material to the dopant molecule, a necessary condition is that the band gap of the dopant is smaller than that of the host material. For phosphorescent emitters it is also important that the host triplet energy level of the host be high enough to enable energy transfer from host to emitting material.

Host and emitting molecules known to be of use include, but are not limited to, those disclosed in U.S. Pat. Nos. 4,768,292; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host materials capable of supporting electroluminescence, and are particularly suitable for light emission of wavelengths longer than 500 nm, e.g., green, yellow, orange, and red.

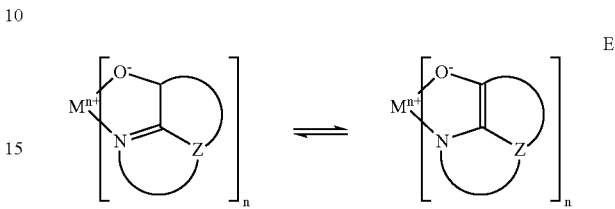

wherein:
    M represents a metal;
    n is an integer of from 1 to 4; and
    Z independently in each occurrence represents the atoms completing a nucleus having at least two fused aromatic rings.

From the foregoing it is apparent that the metal can be a monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Derivatives of 9,10-di-(2-naphthyl)anthracene (Formula F) constitute one class of useful host materials capable of supporting electroluminescence, and are particularly suitable for light emission of wavelengths longer than 400 nm, e.g., blue, green, yellow, orange or red.

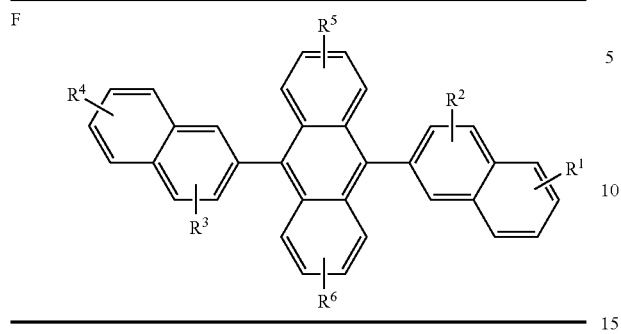

wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful host materials capable of supporting electroluminescence, and are particularly suitable for light emission of wavelengths longer than 400 nm, e.g., blue, green, yellow, orange or red.

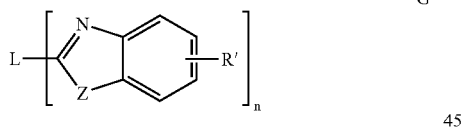

where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms for example phenyl and naphthyl, furyl, thienyl, pyridyl, quinolinyl and other heterocyclic systems; or halo such as chloro, fluoro; or atoms necessary to complete a fused aromatic ring; and
L is a linkage unit including alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

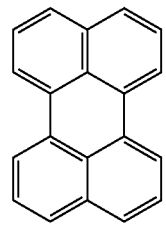

L1

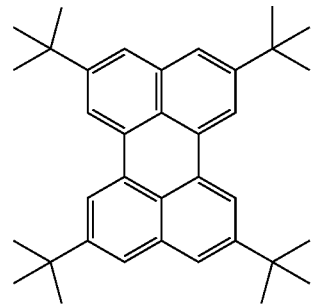

L2

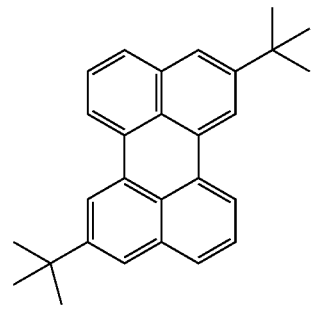

L3

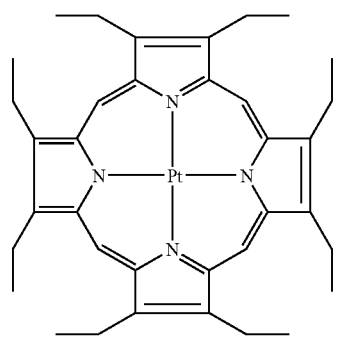

L4

-continued
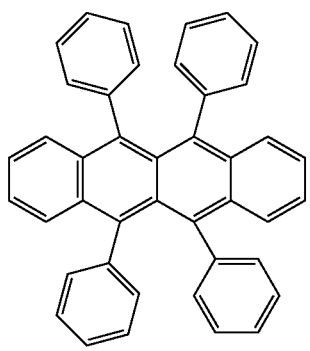
L5
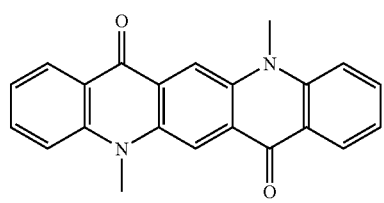
L6
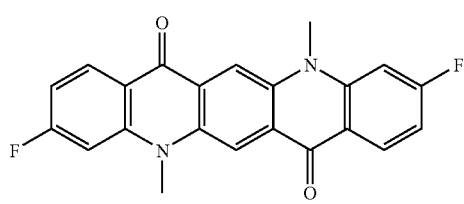
L7
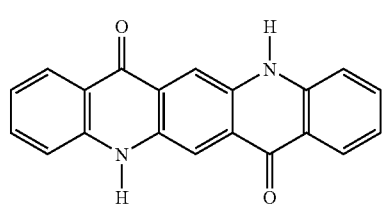
L8
-continued
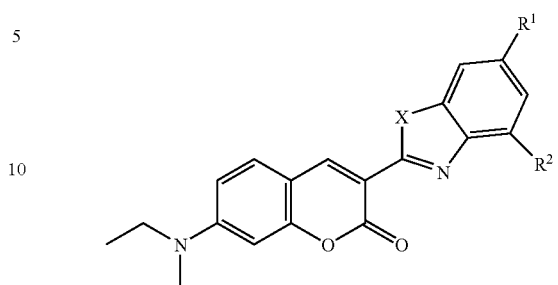
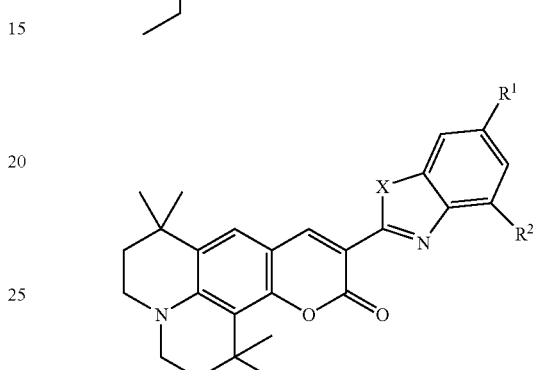
|     | X | R1     | R2     |
|-----|---|--------|--------|
| L9  | O | H      | H      |
| L10 | O | H      | Methyl |
| L11 | O | Methyl | H      |
| L12 | O | Methyl | Methyl |
| L13 | O | H      | t-butyl |
| L14 | O | t-butyl | H     |
| L15 | O | t-butyl | t-butyl |
| L16 | S | H      | H      |
| L17 | S | H      | Methyl |
| L18 | S | Methyl | H      |
| L19 | S | Methyl | Methyl |
| L20 | S | H      | t-butyl |
| L21 | S | t-butyl | H     |
| L22 | S | t-butyl | t-butyl |
| L23 | O | H      | H      |
| L24 | O | H      | Methyl |
| L25 | O | Methyl | H      |
| L26 | O | Methyl | Methyl |
| L27 | O | H      | t-butyl |
| L28 | O | t-butyl | H     |
| L29 | O | t-butyl | t-butyl |
| L30 | S | H      | H      |
| L31 | S | H      | Methyl |
| L32 | S | Methyl | H      |
| L33 | S | Methyl | Methyl |
| L34 | S | H      | t-butyl |
| L35 | S | t-butyl | H     |
| L36 | S | t-butyl | t-butyl |

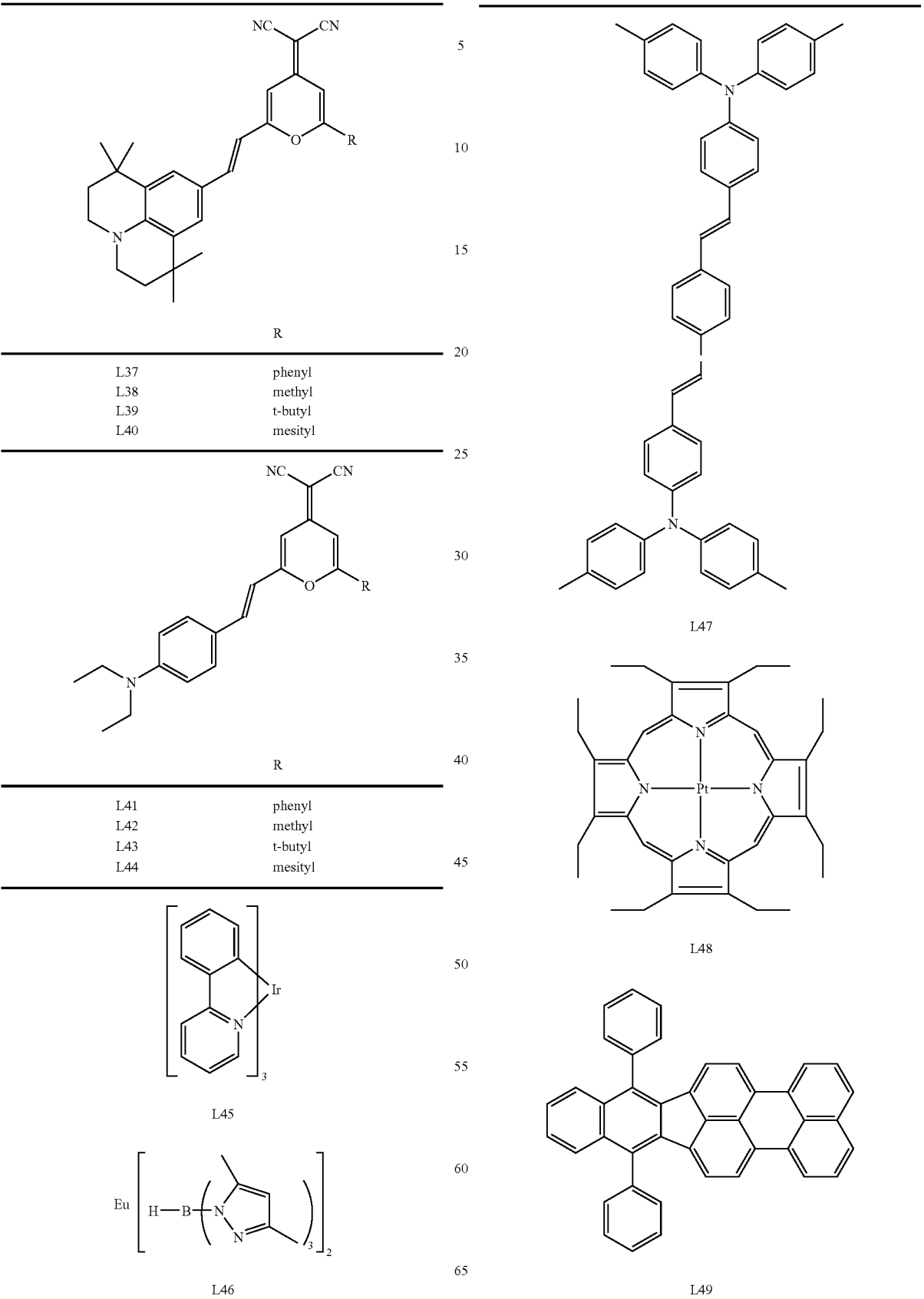

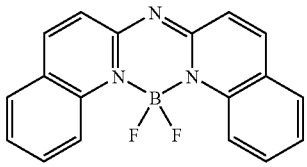

L50

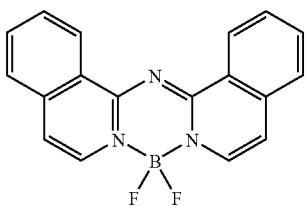

L51

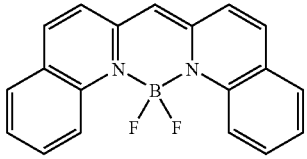

L52

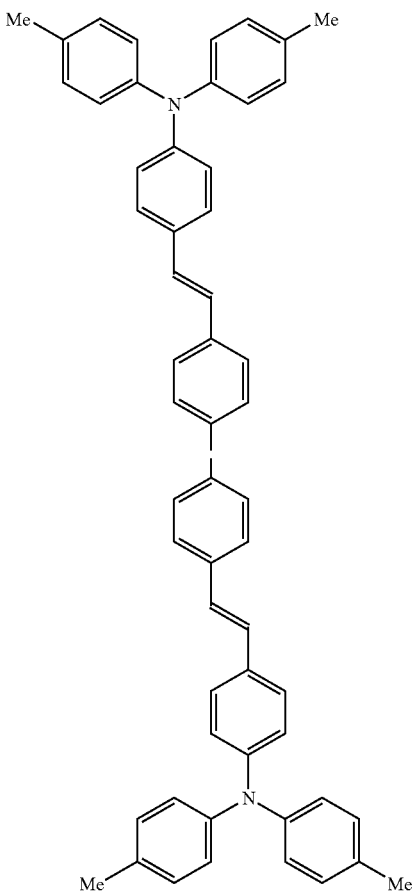

L53

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk et al. in commonly assigned U.S. Pat. No. 6,194,119 B1 and references cited therein. In the case of polymers, small molecule emitting materials can be molecularly dispersed into a polymeric host, or the emitting materials can be added by co-polymerizing a minor constituent into a host polymer.

Although not shown, the device can additionally comprise more than two emissive layers, if such is desired for proper emissive properties of the resulting OLED device.

A common arrangement for light-emitting layers 125 and 130 in a white-light-emitting OLED is for one of the light-emitting layers to be a blue-light-emitting layer, and the other to be a yellow-light-emitting layer. By blue-light-emitting layer, it is meant a layer in which the emission maximum is in the range of 430 to 500 nm. This can include emissions that can be perceived as green by a viewer. By yellow-light-emitting layer, it is meant a layer in which the emission maximum is in the range of 560 to 630 nm. This can include emissions that can be perceived as orange or red by a viewer. A blue light-emitting layer can be either first light-emitting layer 125 or second light-emitting layer 130, and a yellow-light-emitting layer can be the other layer. Thus, either a blue-light-emitting layer or a yellow-light-emitting layer can be in contact with hole-transporting layer 120.

While not always necessary, it is often useful that an electron-transporting layer 135 be formed over light-emitting layers 125 and 130. Electron-transporting layer 135 is in operative association with cathode 140 and second light-emitting layer 130. Second light-emitting layer 130 can be either a yellow-light-emitting layer or a blue-light-emitting layer. Desired electron-transporting materials can be deposited by any suitable means such as evaporation, sputtering, chemical vapor deposition, electrochemical means, thermal transfer, or laser thermal transfer from a donor material. Preferred electron-transporting materials for use in electron-transporting layer 135 are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural Formula E, previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Other electron-transporting materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

It will be understood that, as is common in the art, some of the layers described above can have more than one function. For example, light-emitting layers 125 and 130 can have hole-transporting properties or electron-transporting properties as desired for performance of the OLED device. Hole-transporting layer 120 or electron-transporting layer 135, or both, can have emitting properties. In such a case, fewer layers can be sufficient for the desired emissive properties. For example, a blue-light-emitting hole-transporting layer and a yellow-light-emitting electron-transporting layer can provide the necessary is functionality.

Cathode 140 is formed over the electron-transporting layer 135 or over light-emitting layers 125 and 130 if an electron-transporting layer is not used. When light emission is through the anode 110, the cathode material can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. Nos. 4,885,211 and 5,247,190; JP 3,234,963; U.S. Pat. Nos. 5,703,436; 5,608,287; 5,837,391; 5,677,572; 5,776,622; 5,776,623; 5,714,838; 5,969,474; 5,739,545; 5,981,306; 6,137,223; 6,140,763; and 6,172,459; EP 1 076 368; and U.S. Pat. Nos. 6,278,236; and 6,284,393. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Cathode 140 is an electrode vertically spaced apart from anode 110. Cathode 140 can be part of an active matrix device and in that case is a single electrode for the entire display. Alternatively, cathode 140 can be part of a passive matrix device, in which each cathode 140 can activate a column of pixels, and cathodes 140 are arranged orthogonal to anodes 110.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

OLED devices of this invention can employ various well known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings can be specifically provided over the cover or as part of the cover.

An electron-injecting layer can also be present between the cathode and the electron-transporting layer. Examples of electron-injecting materials include alkali halide salts, such as LiF mentioned above.

There are numerous configurations of a white-light-emitting OLED device wherein the present invention can be successfully practiced. Examples of organic EL media layers that emit white light are described, for example, in EP 1 187 235; U.S. Patent Application Publication 2002/0025419 A1; EP 1 182 244; U.S. Pat. Nos. 5,683,823; 5,503,910; 5,405,709; and 5,283,182. As shown in EP 1187235A2, a white emitting organic EL media can be achieved by the inclusion of the following layers:

a hole-injecting layer 115 disposed over the anode 110;
a hole-transporting layer 120 that is disposed over the hole-injecting layer 115 and is doped with a rubrene compound for emitting light in the yellow region of the spectrum, thus also fulfilling the function of light-emitting layer 125;
a light-emitting layer 130 doped with a blue-light-emitting compound disposed over the hole-transporting layer 120; and
an electron-transporting layer 135.

Unless otherwise specifically stated, use of the term "substituted" or "substituent" means any group or atom other than hydrogen. Unless otherwise provided, when a group (including a compound or complex) containing a substitutable hydrogen is referred to, it is also intended to encompass not only the unsubstituted form, but also form further substituted with any substituent group or groups as herein mentioned, so long as the substituent does not destroy properties necessary for utility. In accordance with the invention described herein, a stabilizing substituted perylene material of this invention can be selected from benzenoid compounds of the following structure:

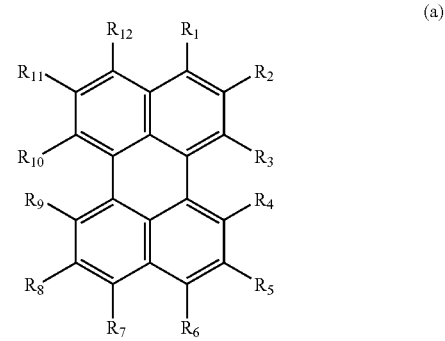

(a)

wherein:

$R_1$ through $R_{12}$ are each individually hydrogen or a selected substituent. Suitably, a substituent can be halogen or can be bonded to the remainder of the molecule by an atom of carbon, silicon, oxygen, nitrogen, phosphorous, or sulfur. The substituent can be, for example, fluoro, cyano, alkoxy, aryloxy, diarylamino, arylalkylamino, dialkylamino, trialkylsilyl, triarylsilyl, diarylalkylsilyl, dialkylarylsilyl, keto, dicyanomethyl, alkyl of from 1 to 48 carbon atoms, alkenyl of from 1 to 48 carbon atoms, alkynyl of from 1 to 48 carbon atoms, aryl of from 5 to 30 carbon atoms, substituted aryl, heterocycle containing at least one nitrogen atom, or at least one oxygen atom, or at least one sulfur atom, or at least one boron atom, or at least one phosphorus atom, or at least one silicon atom, or any combination thereof.

If desired, the substituents can themselves be further substituted one or more times with the described substituent groups. The particular substituents used can be selected by those skilled in the art to attain the desired desirable properties for a specific application and can include, for example, electron-withdrawing groups, electron-donating groups, and steric groups. When a molecule can have two or more substituents, the substituents can be joined together to form a ring such as a fused ring unless otherwise provided. Generally, the above groups and substituents thereof can include those having up to 48 carbon atoms, typically 1 to 36 carbon atoms and usually less than 24 carbon atoms, but greater numbers are possible depending on the particular substituents selected. When two adjacent $R_1$ through $R_{12}$ substituents are joined together to form a ring, these fused rings include (but not limited to) annelated benzo-, naphtho-, anthra-, phenanthro-, fluorantheno-, pyreno-, triphenyleno-, or peryleno-fused ring substituent or their further substituted derivative. Other fused ring substitution can include a 1,2-benzo, 1,2-naphtho, 2,3-naphtho, 1,8-naphtho, 1,2-anthraceno, 2,3-anthraceno, 2,2'-BP, 4,5-PhAn, 1,12-TriP, 1,12-Per, 9,10-PhAn, 1,9-An, 1,10-PhAn, 2,3-PhAn, 1,2-PhAn, 1,10-Pyr, 1,2-Pyr, 2,3-Per, 3,4-FlAn, 2,3-FlAn, 1,2-FlAn, 3,4-Per, 7,8-FlAn, 8,9-FlAn, 2,3-TriP, 1,2-TriP, ace, or indeno substituent or their further substituted derivative. Some of these fused ring derivatives are illustrated for clarity:

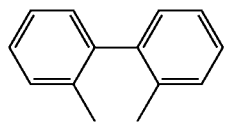

2, 2'-BP,

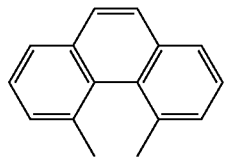

4, 5-PhAn,

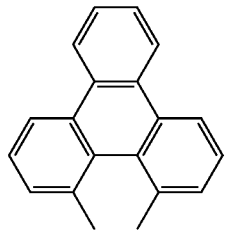

1, 12-TriP,

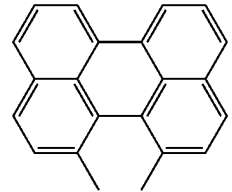

1, 12-Per,

-continued

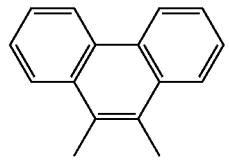

9,10-PhAn,

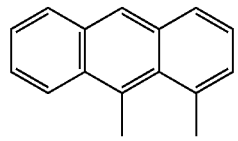

1, 9-An,

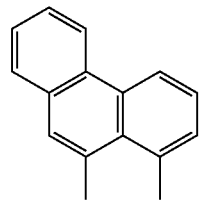

1, 10-PhAn,

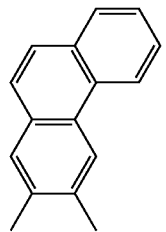

2, 3-PhAn

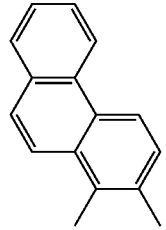

1, 2-PhAn

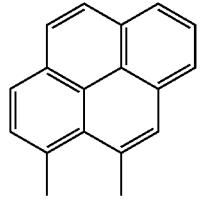

1, 10-Pyr,

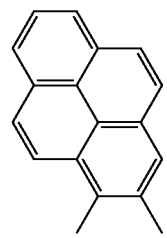

1, 2-Pyr,

-continued 2, 3-Per,

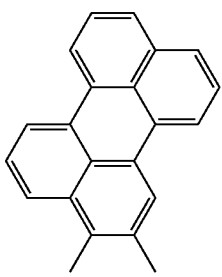

3, 4-FlAn,

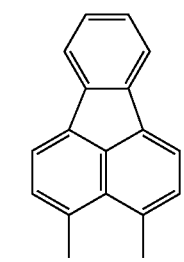

2, 3-FlAn,

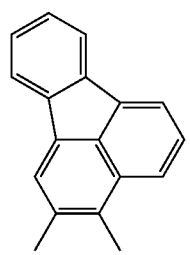

1, 2-FlAn,

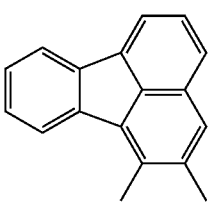

3, 4-Per,

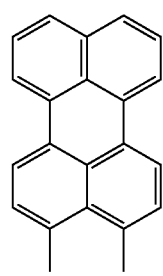

-continued 7, 8-FlAn,

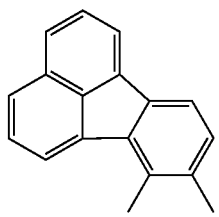

8, 9-FlAn,

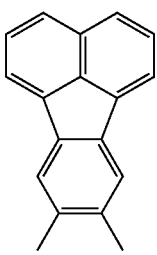

2, 3-TriP,

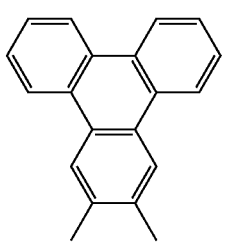

1, 2-TriP

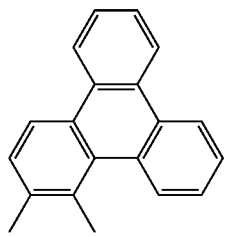

(where bonds that do not form a cycle indicate points of attachment).

Preferred stabilizing substituted perylene materials of this invention include dibenzo[b,k]perylene (which will also be referred to herein as simply dibenzoperylene or DBP) or derivatives thereof.

The stabilizing substituted perylene material can be disposed in one or more of the following layers: the hole-transporting layer, the blue-light-emitting layer, the yellow-light-emitting layer, or the electron-transporting layer (if present), so that the lifetime of the white-light-emitting OLED device is increased as will become clear. For example, dibenzoperylene can be disposed in: the hole-transporting layer and the blue-light-emitting layer; the yellow-light-emitting layer and the blue-light-emitting layer; the electron-transporting layer; the hole-transporting layer; the yellow-light-emitting layer; and the blue-light-emitting layer; or any combination of one or more of the hole-transporting layer; the blue-light-emitting layer; the yellow-light-emitting layer; or the electron-transporting layer.

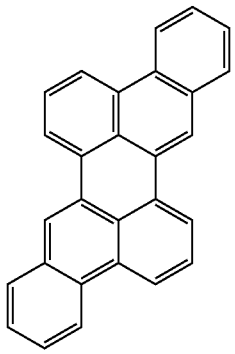

DBP

The invention and its advantages can be better appreciated by the following comparative examples.

EXAMPLE 1 (COMPARATIVE)

A comparative OLED device was constructed in the following manner:
1. A clean glass substrate was vacuum-deposited with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 150 nm layer of 4,4'-bis[N-(1-naphthyl)-N-phenylamino]biphenyl (NPB) as a hole-transporting layer (HTL);
4. A 20 nm layer Alq containing 2% Orange-2 was vacuum-deposited onto the substrate at a coating station that included a heated tantalum boat source to form a yellow-light-emitting layer (yellow EML);

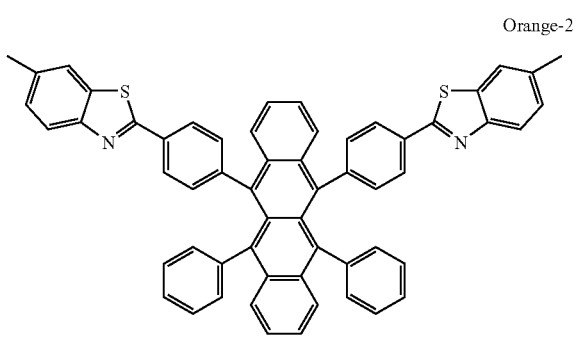

Orange-2

5. A coating of 20 nm of 2-tert-butyl-9,10-bis(2-naphthyl)anthracene (TBADN) with 2% 4-(di-p-tolylamino)-4'-[(di-p-tolylamino)styryl]stilbene was evaporatively deposited on the above substrate to form a blue-light-emitting layer (blue EML);
6. A 35 nm electron-transporting layer (ETL) of tris(8-quinolinolato)aluminum (III) (ALQ) was vacuum-deposited onto the substrate at a coating station that included a heated tantalum boat source; and
7. A 200 nm cathode layer was deposited onto the receiver element at a coating station with separate tantalum boats, one of which contained silver and one of which contained magnesium. The cathode layer was a 10:1 atomic ratio of magnesium and silver.

EXAMPLE 2 (INVENTIVE)

An OLED device was constructed in the manner described in Example 1, except that step 5 was as follows:
5. A coating of 20 nm of 2-tert-butyl-9,10-bis(2-naphthyl)anthracene (TBADN) with 2% 4-(di-p-tolylamino)-4'-[(di-p-tolylamino)styryl]stilbene and 0.5% dibenzo[b,k]perylene (DBP) was evaporatively deposited on the above substrate to form a blue-light-emitting layer.

EXAMPLE 3 (INVENTIVE)

An OLED device was constructed in the manner described in Example 2, except that in step 5 the quantity of DBP was 1.0%.

EXAMPLE 4 (INVENTIVE)

An OLED device was constructed in the manner described in Example 2, except that in step 5 the quantity of DBP was 2.0%.

EXAMPLE 5 (INVENTIVE)

An OLED device was constructed in the manner described in Example 2, except that in step 5 the quantity of DBP was 5.0%.

EXAMPLE 6 (INVENTIVE)

An OLED device was constructed in the manner described in Example 2, except that in step 5 the quantity of DBP was 10%.

RESULTS (EXAMPLES 1–6)

The devices were tested by applying a current across the electrodes of 20 ma/cm$^2$ and measuring the spectrum. The intensity was then monitored as a function of time at constant current. The following table shows the results.

TABLE 1

| Example | Type | % DBP in Blue EML | Luminance (cd/A) @ 20 mA/cm$^2$ | CIEx | CIEy |
|---|---|---|---|---|---|
| 1 | Comparative | 0.0 | 4.76 | 0.25 | 0.33 |
| 2 | Inventive | 0.5 | 5.00 | 0.26 | 0.33 |
| 3 | Inventive | 1.0 | 5.20 | 0.28 | 0.37 |
| 4 | Inventive | 2.0 | 5.40 | 0.30 | 0.42 |
| 5 | Inventive | 5.0 | 5.80 | 0.34 | 0.50 |
| 6 | Inventive | 10 | 6.30 | 0.37 | 0.54 |

This table shows that the color of the emitted light, as shown by the CIEx and CIEy values, changes as the concentration of dibenzoperylene increases. This is because dibenzoperylene is known to act as an emitting dopant, and is further known to form aggregates that affect emission properties. Therefore, it is necessary that the level of dibenzoperylene concentration be selected so that the dibenzoperylene is a non-luminescent dopant. The level at which this occurs will vary depending on the properties of the layer. Table 1 shows that for this particular layer, the dibenzoperylene concentration must be less than 5%.

Figure 2:
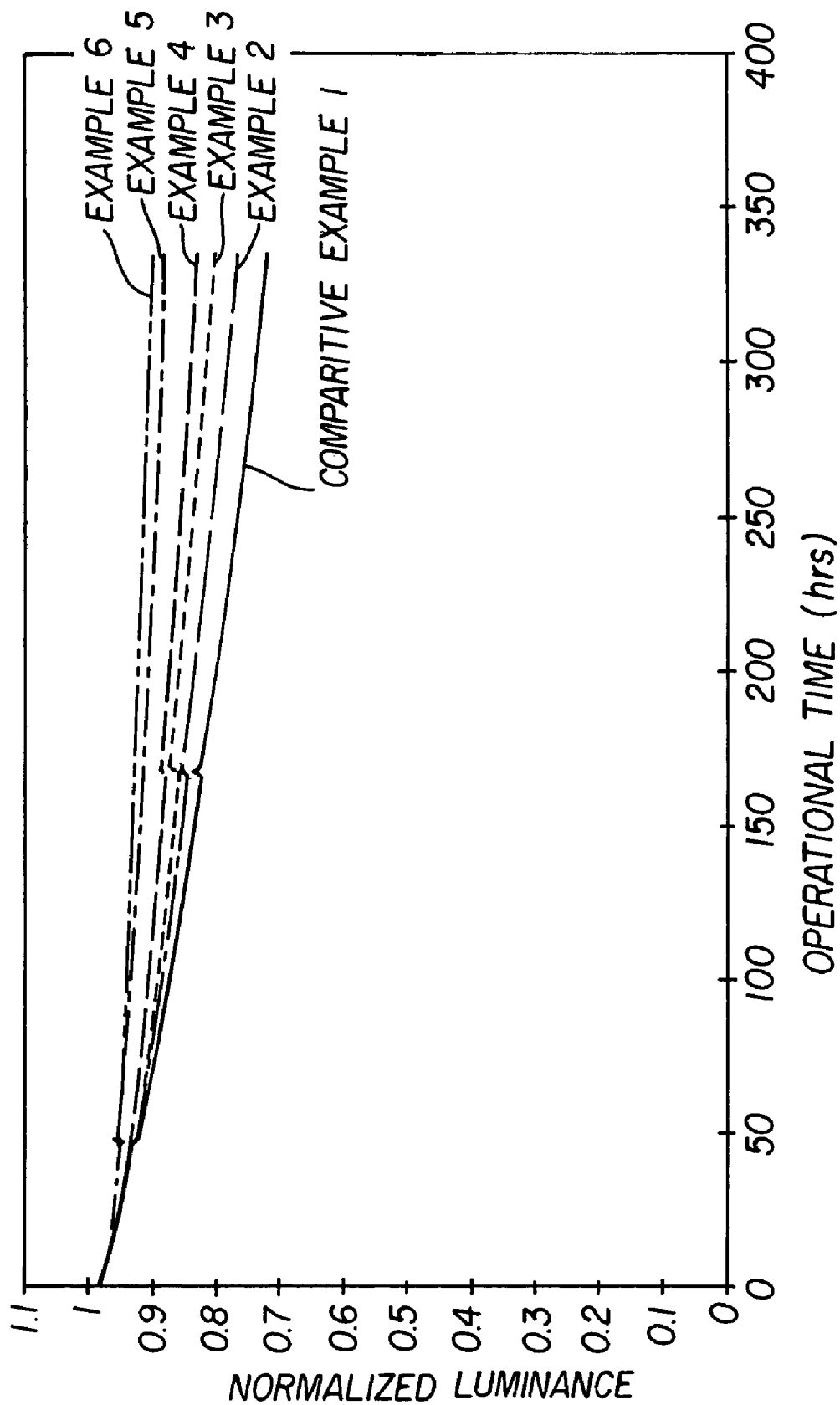
FIG. 2 shows a graph of the fade, or decrease in luminance with time, of one embodiment of the present invention.

Turning now to FIG. 2, there is shown a graph of the fade, or decrease in luminance with time, of the above examples. It can be seen that, as the concentration of dibenzoperylene increases in the blue-light-emitting layer, there is less fade, that is, the lifetime of the white-light-emitting OLED device increases. This device is thus a stabilized white-light-emitting OLED device.

EXAMPLE 7 (COMPARATIVE)

A comparative OLED device was constructed as in Example 1 except that steps 3 and 4 were as follows:
3. The above-prepared substrate was further treated by vacuum-depositing a 130 nm layer of 4,4'-bis[N-(1-naphthyl)-N-phenylamino]biphenyl (NPB) as a hole-transporting layer (HTL); and
4. A 20 nm layer of 4,4'-bis[N-(1-naphthyl)-N-phenylamino]biphenyl (NPB) containing 2% Orange-2 dopant was vacuum-deposited onto the substrate at a coating station that included a heated tantalum boat source to form a yellow-light-emitting layer (yellow EML).

EXAMPLE 8 (INVENTIVE)

An OLED device was constructed in the manner described in Example 7, except that step 5 was as follows:
5. A coating of 20 nm of 2-tert-butyl-9,10-bis(2-naphthyl) anthracene (TBADN) with 2% 4-(di-p-tolylamino)-4'-[(di-p-tolylamino)styryl]stilbene and 0.5% dibenzo[b,k]perylene (DBP) was evaporatively deposited on the above substrate to form a blue-light-emitting layer (blue EML).

EXAMPLE 9 (INVENTIVE)

An OLED device was constructed in the manner described in Example 8, except that in step 5 the quantity of DBP was 1.0% and the thickness of the layer was 20.5 nm.

EXAMPLE 10 (INVENTIVE)

An OLED device was constructed in the manner described in Example 8, except that in step 5 the quantity of DBP was 2.0% and the thickness of the layer was 20.5 nm.

Example 11 (INVENTIVE)

An OLED device was constructed in the manner described in Example 8, except that in step 5 the quantity of DBP was 5.2% and the thickness of the layer was 21 nm.

Example 12 (INVENTIVE)

An OLED device was constructed in the manner described in Example 8, except that in step 5 the quantity of DBP was 9.7% and the thickness of the layer was 22 nm.

RESULTS (EXAMPLES 7–12)

The devices were tested by applying a current across the electrodes of 40 ma/cm$^2$ at room temperature and measuring the spectrum. The intensity was then monitored as a function of time at constant current. The following table shows the results.

TABLE 2

| Example | Type | % DBP in blue EML | Time to 90% Luminance (hrs) | CIEx | CIEy |
|---|---|---|---|---|---|
| 7 | Comparative | 0.0 | 35 | 0.25 | 0.33 |
| 8 | Inventive | 0.5 | 40 | 0.26 | 0.33 |
| 9 | Inventive | 1.0 | 45 | 0.28 | 0.37 |
| 10 | Inventive | 2.0 | 80 | 0.30 | 0.43 |
| 11 | Inventive | 5.2 | 150 | 0.34 | 0.50 |
| 12 | Inventive | 9.7 | 200 | 0.37 | 0.54 |

It can be seen in Table 2 that the stability, as measured by the hours of operation required for the luminance to decay to 90% of its original value, can be improved by the addition of dibenzoperylene to the blue-light-emitting layer. As the concentration of dibenzoperylene increases, the time required for the luminance to decay increases, that is, the lifetime of the white-light-emitting OLED device increases. The color of the light emitted also changes, and it is necessary to keep the dibenzoperylene concentration below 5%.

EXAMPLE 13 (COMPARATIVE)

A comparative OLED device was constructed as described in Example 1 except that steps 3–5 were as follows:
3. The above-prepared substrate was further treated by vacuum-depositing a 130 nm layer of 4,4'-bis[N-(1-naphthyl)-N-phenylamino]biphenyl (NPB) as a hole-transporting layer (HTL);
4. A 20 nm layer of 4,4'-bis[N-(1-naphthyl)-N-phenylamino]biphenyl (NPB) containing 2.5% Orange-2 dopant was vacuum-deposited onto the substrate at a coating station that included a heated tantalum boat source to form a yellow-light-emitting layer (yellow EML); and
5. A coating of 20 nm of 2-tert-butyl-9,10-bis(2-naphthyl) anthracene (TBADN) with 2.5% 4-(di-p-tolylamino)-4'-[(di-p-tolylamino)styryl]stilbene was evaporatively deposited on the above substrate to form a blue-light-emitting layer (blue EML).

EXAMPLE 14 (INVENTIVE)

An OLED device was constructed in the manner described in Example 13, except that step 4 was as follows:
4. A 20 nm layer of 4,4'-bis[N-(1-naphthyl)-N-phenylamino]biphenyl (NPB) containing 2.5% Orange-2 dopant and 1.0% dibenzo[b,k]perylene (DBP) was evaporatively deposited on the above substrate to form a yellow-light-emitting layer (yellow EML).

EXAMPLE 15 (INVENTIVE)

An OLED device was constructed in the manner described in Example 14, except that in step 4 the quantity of DBP was 2.5% and the thickness of the layer was 21 nm.

EXAMPLE 16 (INVENTIVE)

An OLED device was constructed in the manner described in Example 14, except that in step 4 the quantity of DBP was 5.0% and the thickness of the layer was 21.5 nm.

EXAMPLE 17 (INVENTIVE)

An OLED device was constructed in the manner described in Example 14, except that in step 4 the quantity of DBP was 10% and the thickness of the layer was 22.5 nm.

EXAMPLE 18 (INVENTIVE)

An OLED device was constructed in the manner described in Example 14, except that in step 4 the quantity of DBP was 25% and the thickness of the layer was 25.5 nm.

RESULTS (EXAMPLES 13–18)

The devices were tested by applying a current across the electrodes of 40 ma/cm$^2$ at 70° C. and measuring the spectrum. The intensity was then monitored as a function of time at constant current. The following table shows the results.

TABLE 3

| Example | Type | % DBP in yellow EML | Time to 90% Luminance (hrs) | CIEx | CIEy |
|---|---|---|---|---|---|
| 13 | Comparative | 0.0 | 30 | 0.36 | 0.37 |
| 14 | Inventive | 1.0 | 150 | 0.38 | 0.39 |
| 15 | Inventive | 2.5 | 200 | 0.44 | 0.43 |
| 16 | Inventive | 5.0 | 170 | 0.46 | 0.44 |
| 17 | Inventive | 10 | 120 | 0.49 | 0.46 |
| 18 | Inventive | 25 | 100 | 0.45 | 0.44 |

It can be seen in Table 3 that the stability, as measured by the hours of operation required for the luminance to decay to 90% of its original value, can be improved by the addition of dibenzoperylene to the yellow-light-emitting layer. With the addition of dibenzoperylene, the time required for the luminance to decay increases, that is, the lifetime of the white-light-emitting OLED device increases. The color of the light emitted also changes, and it is necessary to keep the dibenzoperylene concentration below 10% and preferably below 5%.

EXAMPLE 19 (COMPARATIVE)

A comparative OLED device was constructed as described for Example 7.

EXAMPLE 20 (INVENTIVE)

An OLED device was constructed in the manner described in Example 19, except that steps 4 and 5 were as follows:
4. A 20 nm layer of 4,4'-bis[N-(1-naphthyl)-N-phenylamino]biphenyl (NPB) containing 2% Orange-2 dopant and 0.5% dibenzo[b,k]perylene (DBP) was vacuum-deposited onto the substrate at a coating station that included a heated tantalum boat source to form a yellow-light-emitting layer (yellow EML); and
5. A coating of 20 nm of 2-tert-butyl-9,10-bis(2-naphthyl) anthracene (TBADN) with 2% 4-(di-p-tolylamino)-4'-[(di-p-tolylamino)styryl]stilbene and 0.5% dibenzo[b, k]perylene (DBP) was evaporatively deposited on the above substrate to form a blue-light-emitting layer (blue EML).

EXAMPLE 21 (INVENTIVE)

An OLED device was constructed in the manner described in Example 20, except that in step 4 the quantity of DBP was 1.0%.

EXAMPLE 22 (INVENTIVE)

An OLED device was constructed in the manner described in Example 19, except that steps 5 and 6 were as follows:
5. A coating of 20 nm of 2-tert-butyl-9,10-bis(2-naphthyl) anthracene (TBADN) with 2% 4-(di-p-tolylamino)-4'-[(di-p-tolylamino)styryl]stilbene and 0.5% dibenzo[b, k]perylene (DBP) was evaporatively deposited on the above substrate to form a blue-light-emitting layer (blue EML); and
6. A 20 nm doped electron-transporting layer (ETL) of tris(8-quinolinolato)aluminum (III) (ALQ) with 0.5% dibenzo[b,k]perylene (DBP) was vacuum-deposited onto the substrate at a coating station that included a heated tantalum boat source. A 15 nm layer of undoped tris(8-quinolinolato)aluminum (III) (ALQ) was then vacuum-deposited onto the substrate.

EXAMPLE 23 (INVENTIVE)

An OLED device was constructed in the manner described in Example 22, except that in step 6 the quantity of DBP was 1.0%.

EXAMPLE 24 (INVENTIVE)

An OLED device was constructed in the manner described in Example 22, except that step 4 was as follows:
4. A 20 nm layer of 4,4'-bis[N-(1-naphthyl)-N-phenylamino]biphenyl (NPB) containing 2% Orange-2 dopant and 1.0% dibenzo[b,k]perylene (DBP) was vacuum-deposited onto the substrate at a coating station that included a heated tantalum boat source to form a yellow-light-emitting layer (blue EML).

RESULTS (EXAMPLES 19–24)

The devices were tested by applying a current across the electrodes of 40 ma/cm$^2$ at room temperature and measuring the spectrum. The intensity was then monitored as a function of time at constant current. The following table shows the results.

TABLE 4

| Example | Type | % DBP in yellow EML | % DBP in blue EML | % DBP in ETL | Time to 90% Luminance (hrs) | CIEx | CIEy |
|---|---|---|---|---|---|---|---|
| 19 | Comparative | 0.0 | 0.0 | 0.0 | 75 | 0.29 | 0.33 |
| 20 | Inventive | 0.5 | 0.5 | 0.0 | 135 | 0.36 | 0.38 |
| 21 | Inventive | 1.0 | 0.5 | 0.0 | 150 | 0.38 | 0.39 |
| 22 | Inventive | 0.0 | 0.5 | 0.5 | 115 | 0.32 | 0.36 |
| 23 | Inventive | 0.0 | 0.5 | 1.0 | 120 | 0.33 | 0.36 |
| 24 | Inventive | 1.0 | 0.5 | 0.5 | 180 | 0.40 | 0.42 |

It can be seen in Table 4 that the stability, as measured by the hours of operation required for the luminance to decay to 90% of its original value, can be improved by the addition of dibenzoperylene to various combinations of the yellow-light-emitting layer, the blue-light-emitting layer, and the electron-transporting layer. In these examples, the yellow-light-emitting layer is also a hole-transporting layer. With the addition of dibenzoperylene, the time required for the luminance to decay increases, that is, the lifetime of the white-light-emitting OLED device increases.

EXAMPLE 25 (COMPARATIVE)

A comparative OLED device was constructed as described for Example 13.

EXAMPLE 26 (INVENTIVE)

An OLED device was constructed in the manner described in Example 25, except that step 6 was as follows:
6. A 20 nm doped electron-transporting layer (ETL) of tris(8-quinolinolato)aluminum (III) (ALQ) with 2.5% dibenzo[b,k]perylene (DBP) was vacuum-deposited onto the substrate at a coating station that included a heated tantalum boat source. A 15 nm layer of undoped tris(8-quinolinolato)aluminum (III) (ALQ) was then vacuum-deposited onto the substrate.

EXAMPLE 27 (INVENTIVE)

An OLED device was constructed in the manner described in Example 26, except that in step 6 the quantity of DBP was 18%.

RESULTS (EXAMPLES 25–27)

The devices were tested by applying a current across the electrodes of 40 ma/cm$^2$ at 70° C. and measuring the spectrum. The intensity was then monitored as a function of time at constant current. The following table shows the results.

TABLE 5

| Example | Type | % DBP in ETL | Time to 90% Luminance (hrs) | CIEx | CIEy |
|---------|------|--------------|-----------------------------|------|------|
| 25 | Comparative | 0.0 | 85 | 0.46 | 0.43 |
| 26 | Inventive | 2.5 | 140–300 | 0.47 | 0.44 |
| 27 | Inventive | 18 | 200–360 | 0.46 | 0.44 |

It can be seen in Table 5 that the stability, as measured by the hours of operation required for the luminance to decay to 90% of its original value, can be improved by the addition of dibenzoperylene to the electron-transporting layer. With the addition of dibenzoperylene, the time required for the luminance to decay increases, that is, the lifetime of the white-light-emitting OLED device increases.

EXAMPLE 28 (COMPARATIVE)

A comparative blue-light-emitting OLED device (that is, part of a white-light-emitting OLED device) was constructed in the following manner:
1. A clean glass substrate was vacuum-deposited with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 130 nm layer of 4,4'-bis[N-(1-naphthyl)-N-phenylamino]biphenyl (NPB) as a hole-transporting layer (HTL);
4. A coating of 20 nm of 2-tert-butyl-9,10-bis(2-naphthyl)anthracene (TBADN) with 2% 4-(di-p-tolylamino)-4'-[(di-p-tolylamino)styryl]stilbene was evaporatively deposited on the above substrate to form a blue-light-emitting layer (blue EML);
5. A 35 nm electron-transporting layer (ETL) of tris(8-quinolinolato)aluminum (III) (ALQ) was vacuum-deposited onto the substrate at a coating station that included a heated tantalum boat source; and
6. A 200 nm cathode layer was deposited onto the receiver element at a coating station with separate tantalum boats, one of which contained silver and one of which contained magnesium. The cathode layer was a 10:1 atomic ratio of magnesium and silver.

EXAMPLE 29 (INVENTIVE)

An OLED device was constructed in the manner described in Example 28, except that steps 3 and 4 were as follows:
3. The above-prepared substrate was further treated by vacuum-depositing a 130 nm layer of 4,4'-bis[N-(1-naphthyl)-N-phenylamino]biphenyl (NPB) with 1.0% dibenzo[b,k]perylene (DBP) as a hole-transporting layer (HTL); and
4. A coating of 20 nm of 2-tert-butyl-9,10-bis(2-naphthyl)anthracene (TBADN) with 2% 4-(di-p-tolylamino)-4'-[(di-p-tolylamino)styryl]stilbene and 0.5% dibenzo[b,k]perylene (DBP) was evaporatively deposited on the above substrate to form a blue-light-emitting layer (blue EML).

EXAMPLE 30 (INVENTIVE)

An OLED device was constructed in the manner described in Example 29, except that steps 4 and 5 were as follows:
4. A coating of 20 nm of 2-tert-butyl-9,10-bis(2-naphthyl)anthracene (TBADN) with 2% 4-(di-p-tolylamino)-4'-[(di-p-tolylamino)styryl]stilbene and 0.5% dibenzo[b,k]perylene (DBP) was evaporatively deposited on the above substrate to form a blue-light-emitting layer (blue EML); and
5. A 20 nm doped electron-transporting layer (ETL) of tris(8-quinolinolato)aluminum (III) (ALQ) with 1.0% dibenzo[b,k]perylene (DBP) was vacuum-deposited onto the substrate at a coating station that included a heated tantalum boat source. A 15 nm layer of undoped tris(8-quinolinolato)aluminum (III) (ALQ) was then vacuum-deposited onto the substrate.

EXAMPLE 31 (INVENTIVE)

An OLED device was constructed in the manner described in Example 29, except that steps 3–5 were as follows:
3. The above-prepared substrate was further treated by vacuum-depositing a 130 nm layer of 4,4'-bis[N-(1-naphthyl)-N-phenylamino]biphenyl (NPB) with 0.5% dibenzo[b,k]perylene (DBP) as a hole-transporting layer (HTL);

4. A coating of 20 nm of 2-tert-butyl-9,10-bis(2-naphthyl) anthracene (TBADN) with 2% 4-(di-p-tolylamino)-4'-[(di-p-tolylamino)styryl]stilbene and 0.5% dibenzo[b,k]perylene (DBP) was evaporatively deposited on the above substrate to form a blue-light-emitting layer (blue EML); and 5. A 20 nm doped electron-transporting layer (ETL) of tris(8-quinolinolato)aluminum (III) (ALQ) with 0.5% dibenzo[b,k]perylene (DBP) was vacuum-deposited onto the substrate at a coating station that included a heated tantalum boat source. A 15 nm layer of undoped tris(8-quinolinolato)aluminum (III) (ALQ) was then vacuum-deposited onto the substrate.

RESULTS (EXAMPLES 28–31)

Figure 3:
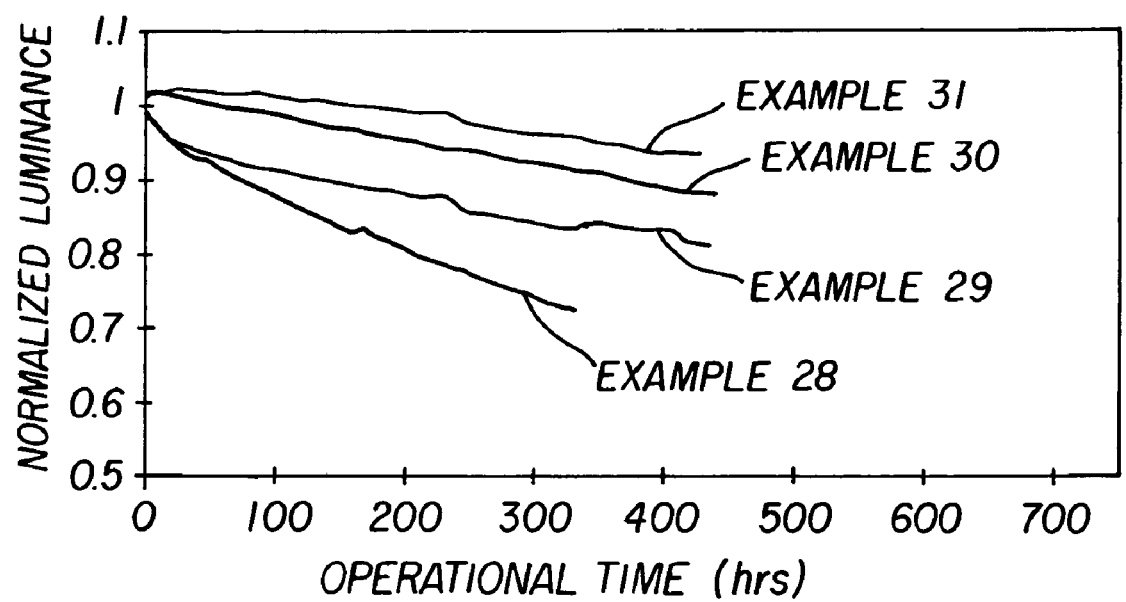
FIG. 3 shows a graph of the fade, or decrease in luminance with time, of several other embodiments of the present invention.

The devices were tested by applying a current across the electrodes of 40 ma/cm$^2$ and measuring the spectrum. The intensity was then monitored as a function of time at constant current. Turning now to FIG. 3, there is shown a graph of the fade, or decrease in luminance with time, of the above examples. It can be seen that the addition of dibenzoperylene to various combinations of the hole-transporting layer, the blue-light-emitting layer, and the electron-transporting layer produces less fade, that is, the lifetime of the OLED device increases.

The invention has been described in detail with particular reference to certain preferred embodiments thereof, but it will be understood that variations and modifications can be effected within the spirit and scope of the invention.

PARTS LIST

10 OLED device pixel
105 substrate
110 anode
115 hole-injecting layer
120 hole-transporting layer
125 light-emitting layer
130 light-emitting layer
135 electron-transporting layer
140 cathode

What is claimed is:

1. A stabilized white-light-emitting OLED device, comprising:
   a) an anode;
   b) a cathode;
   c) two light-emitting layers disposed between the anode and the cathode; and
   d) a stabilizing substituted perylene material having a concentration selected so that it does not emit light to thereby increase the lifetime of the white-light-emitting OLED device.

2. The stabilized white-light-emitting OLED device of claim 1 wherein the perylene material is a substituted or unsubstituted benzoperylene.

3. The stabilized white-light-emitting OLED device of claim 1 wherein the perylene material is a substituted or unsubstituted dibenzoperylene.

4. The stabilized white-light-emitting OLED device of claim 1 wherein the perylene material is a substituted or unsubstituted tribenzoperylene.

5. A stabilized white-light-emitting OLED device, comprising:
   a) an anode and a cathode spaced apart from the anode;
   b) a hole-transporting layer disposed over the anode;
   c) a yellow-light-emitting layer and a blue-light-emitting layer disposed between the hole transporting layer and the cathode; and
   d) a stabilizing substituted perylene material disposed at least in one of the following layers: the hole-transporting layer; the blue-light-emitting layer; or the yellow-light-emitting layer and having a concentration selected so that it does not emit light to thereby increase the lifetime of the white-light-emitting OLED device.

6. The stabilized white-light-emitting OLED device of claim 5 wherein the substituted perylene material is a substituted or unsubstituted benzoperylene.

7. The stabilized white-light-emitting OLED device of claim 5 wherein the substituted perylene material is a substituted or unsubstituted dibenzoperylene.

8. The stabilized white-light-emitting OLED device of claim 5 wherein the substituted perylene material is a substituted or unsubstituted tribenzoperylene.

9. The stabilized white-light-emitting OLED device of claim 5 wherein the substituted perylene material is disposed at least in two of the following layers: the hole-transporting layer; the blue-light-emitting layer; or the yellow-light-emitting layer.

10. The stabilized white-light-emitting OLED device of claim 6 wherein the substituted perylene material is disposed at least in two of the following layers: the hole-transporting layer, the blue-light-emitting layer, or the yellow-light-emitting layer.

11. The stabilized white-light-emitting OLED device of claim 7 wherein the substituted perylene material is disposed at least in two of the following layers: the hole-transporting layer; the blue-light-emitting layer; or the yellow-light-emitting layer.

12. The stabilized white-light-emitting OLED device of claim 8 wherein the substituted perylene material is disposed at least in two of the following layers: the hole-transporting layer; the blue-light-emitting layer; or the yellow-light-emitting layer.

13. A stabilized white-light-emitting OLED device, comprising:
   a) an anode and a cathode spaced apart from the anode;
   b) a hole-transporting layer disposed over the anode;
   c) a yellow-light-emitting layer and a blue-light-emitting layer disposed between the hole transporting layer and the cathode;
   d) an electron-transporting layer adjacent to the cathode and either the yellow-light-emitting layer or the blue-light-emitting layer; and
   e) a stabilizing substituted perylene material disposed at least in one of the following layers: the hole-transporting layer, the blue-light-emitting layer, the yellow-light-emitting layer, or the electron-transporting layer and having a concentration selected so that it does not emit light to thereby increase the lifetime of the white-light-emitting OLED device.

14. The stabilized white-light-emitting OLED device of claim 13 wherein the substituted perylene material is disposed at least in two of the following layers: the hole-transporting layer; the blue-light-emitting layer; the yellow-light-emitting layer; or the electron-transporting layer.

15. The stabilized white-light-emitting OLED device of claim 13 wherein the substituted perylene material is disposed at least in three of the following layers: the hole-transporting layer; the blue-light-emitting layer; the yellow-light-emitting layer; or the electron-transporting layer.

16. The stabilized white-light-emitting OLED device of claim 13 wherein substituted perylene material is disposed in the hole-transporting layer and the blue-light-emitting layer.

17. The stabilized white-light-emitting OLED device of claim 13 wherein the yellow-light-emitting layer is in contact with the hole-transporting layer.

18. The stabilized white-light-emitting OLED device of claim 13 wherein the blue-light-emitting layer is in contact with the hole-transporting layer.

19. The stabilized white-light-emitting OLED device of claim 13 wherein the level of substituted perylene material concentration in one or more layers is selected so that the substituted perylene material is a non-luminescent dopant.

20. The stabilized white-light-emitting OLED device of claim 13 wherein the substituted perylene material is dibenzpo[b,k]perylene.

* * * * *

UNITED STATES PATENT AND TRADEMARK OFFICE
CERTIFICATE OF CORRECTION

PATENT NO.       : 7,238,436 B2                                          Page 1 of 1
APPLICATION NO. : 10/690940
DATED            : July 3, 2007
INVENTOR(S)      : Tukaram K. Hatwar et al.

It is certified that error appears in the above-identified patent and that said Letters Patent is hereby corrected as shown below:

Claim 20, Column 34, Line 6-7    In Claim 20, delete "dibenzpo[b,k]perylene" and insert -- dibenzo[b,k]perylene --

Signed and Sealed this

Twenty-ninth Day of April, 2008

JON W. DUDAS
*Director of the United States Patent and Trademark Office*